(12) United States Patent
Scott

(10) Patent No.: US 6,249,452 B1
(45) Date of Patent: Jun. 19, 2001

(54) SEMICONDUCTOR DEVICE HAVING OFFSET TWISTED BIT LINES

(75) Inventor: David B. Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/400,694

(22) Filed: Sep. 22, 1999

Related U.S. Application Data

(60) Provisional application No. 60/102,044, filed on Sep. 28, 1998.

(51) Int. Cl.[7] ........................................... G11C 5/08
(52) U.S. Cl. ............................. 365/69; 365/63; 365/51
(58) Field of Search .................................. 365/69, 63, 51

(56) References Cited

U.S. PATENT DOCUMENTS 5,287,322 * 2/1994 Rastegar ........................... 365/230.05
5,534,732 * 7/1996 DeBrosse et al. .................... 257/776

* cited by examiner

Primary Examiner—David Nelms
Assistant Examiner—Connie C. Yoha
(74) Attorney, Agent, or Firm—Dwight N. Holmbo; Wade James Brady, III; Frederick J. Telecky, Jr.

(57) ABSTRACT

A compact data line arrangement (600) includes "twisted" data line pairs (604a–604c) disposed in a first direction. Each twisted data line pair (604a–604c) includes an upper segment pair (608a–608f) that is connected to a lower segment pair (610a–610f) by a twist structure (612a–612c). The upper and lower segment pairs (608a–608f and 610a–610f) can be formed with a first pitch using phase-shifted lithography. The twist structures (612a–612c) are formed from a second conductive layer, and have a greater pitch than the first pitch. The twist structures (612a–612c) are generally arranged in a second direction that is perpendicular to the first direction. Selected twist structures (612b) are offset in the first direction with respect to adjacent twist structures (612a and 612c). The offset twist structures (612a–612c) allow supplemental conductive lines (618) to be formed from the first conductive layer that extend in the first direction, between adjacent offset twist structures (612a and 612b).

15 Claims, 5 Drawing Sheets

SEMICONDUCTOR DEVICE HAVING OFFSET TWISTED BIT LINES

This application is a continuation of provisional application No. 60/102,044 filed Sep. 28, 1998.

TECHNICAL FIELD

The present invention relates generally to lines that carry data in semiconductor integrated circuit devices, and more particularly to densely packed data lines in such devices.

BACKGROUND OF THE INVENTION

The fabrication of semiconductor devices typically includes the depositing and patterning of insulating layers and conductive layers. In general, the fabrication of a device can start with the patterning of a semiconductor substrate into active area portions separated from one another by insulation. Subsequent alternating insulation and conductive layers are then formed over, and sometimes coupled to the substrate, to interconnect the various circuit elements within the device (such as transistors, capacitors, resistors and the like).

The patterning of an insulating or conductive layer can be accomplished using a lithography and etch step. The lithography step involves depositing an alterable material, referred to as a "resist" on the layer that is to be patterned. The resist is then "developed" or "printed" into a pattern by the application of some form of radiation. For example, "photoresists" can be patterned by the application of light. Other resists can be patterned by x-rays, electron beams or ion beams, to name just a few examples. The pattern within a resist is typically developed by situating a "mask" containing the desired pattern over the resist. The mask includes "transparent" portions that will allow radiation to pass through, and "blocking" portions that will block the radiation. When the radiation is applied, the areas of resist situated below the transparent mask portions will be developed while those below blocking portions will not be developed. The undeveloped portions of resist can then be removed with a solvent, leaving the desired pattern over the fabrication layer. In the case of photolithography, the developing of resist will depend on the intensity of the light applied to the resist.

The developed pattern of resist can then serve as an etch mask for the fabrication layer below. An etch can be applied, and those portions of the fabrication layer that are covered by the etch mask will be protected from the etch. The exposed portions of the fabrication layer will be removed. In this manner, structures or "features" are formed in the fabrication layer by the etch step. For example, in the event the fabrication layer is a conductive layer, the etch step can create conductive interconnects between various portions of a device. In the event the fabrication layer is an insulation layer, the etch step can create contact holes through the insulation layer to a conductive layer below.

In order to fabricate as small a semiconductor device as possible, and hence produce such devices in a more cost-effective manner, efforts are continually made to form features with as small a size as possible. The smallest manufacturable feature size is often referred to as a minimum feature size. The minimum feature size will determine how close structures can be situated relative to one another in the semiconductor device. In addition to impacting the resulting size of a semiconductor device, feature sizes can also affect the functionality of a semiconductor device. For example, in order to create accurate etch mask patterns from a layer of resist, sufficient radiation must be applied to the resist to print the pattern. However, as masks are made for devices having increasingly smaller features sizes, it becomes more and more difficult to control the resulting radiation intensity necessary to produce uniform feature sizes across a semiconductor device.

A drawback to prior art conventional photolithography approaches is set forth in FIG. 1. FIG. 1 includes a portion of a photolithography mask 100 ("photomask") that includes transparent portions 102 and blocking portions 104. Ideally, the two transparent portions 102 would create two distinct intensity patterns, and thus produce two adjacent features. Set forth below the photomask 100 is a first graph 106 illustrating the amplitude of the light waveforms that result from the photomask 100. Below the first graph 106 is a second graph 108 setting forth the resulting light intensity provided by the photomask 100 transparent portions 102. The intensity graph 108 shows that when smaller feature sizes are required, it is difficult to achieve two distinct intensity waveform, and thus two distinct features.

FIG. 2 illustrates one approach to producing smaller features sizes using the same light wavelength as that shown in FIG. 1. FIG. 2 includes a photomask 200 having transparent portions 202a and 202b, as well as blocking portions 204. However, unlike the photomask 100 of FIG. 1, the photomask 200 of FIG. 2 is a phase-shifted photomask. Thus, while the transparent portions (202a and 202b) allow light to pass through, transparent portion 202b introduces a phase shift in the light with respect to transparent portion 202a. The phase shift may be accomplished by making the transparent portion 202b from a different material, different combination of materials, or a different thickness than transparent portion 202a.

The resulting light amplitude response of the phase-shift mask 200 is set forth in a first graph 206. As shown, the light provided by transparent portion 202b is shifted in phase, by approximately 180°, from that provided by transparent potion 202a. The resulting light intensity is shown in a second graph 208. As shown in the second graph 208, the phase shift causes the resulting intensity between the two peaks to be less, due to interference effects. Consequently, a better intensity profile, and hence better resist etch mask can be created. In this manner, phase shifted masks can create smaller minimum feature sizes than conventional (non phase-shifted) lithography approaches. It is noted however, that adjacent features must be patterned by using light of opposing phases.

One particular type of semiconductor device in which minimum feature sizes can play an important role is the semiconductor memory device. Semiconductor memory devices typically ihclude an array of densely packed memory cells that are connected to one another by conductive lines. In most random access memory (RAM) and read-only-memory (ROM) configurations, the memory cells are arranged in rows and columns. Densely packed conductive lines are disposed over the memory cells and can include bit lines, extending in the column direction, and word lines extending in the row direction. In order to provide as dense a device as possible, it is advantageous to make the conductive lines with as small a feature size as possible.

Conventional bit line layouts (i.e., a series of parallel lines) can benefit from phase-shifted mask approaches by alternating the phase of the light used to pattern adjacent bit lines. For example, the light used to pattern even bit lines could be at one phase, while the phase of light used to pattern odd bit lines is shifted by 180°. Unfortunately, for more complex bit lines, phase-shifted masks may not be applicable.

An example of a bit line arrangement that is not conducive to phase shifted masks is set forth in FIG. 3. The bit line arrangement of FIG. 3 is a "triple twist" bit line arrangement, and is designated by the general reference character 300. The arrangement 300 is shown to include first twisted bit line pairs (302a and 302c) and a second twisted bit line pair 302b. The bit line pairs (302a and 302b) are considered "twisted" in that the orientation of the bit lines within each pair switches with respect to one another. For example, the bit line pair 302a includes a first bit line 304a and a second bit line 304b. Toward the top of the figure, bit line 304a is to the left of bit line 304b. Toward the bottom of FIG. 3, bit line 304a is to the ,right of bit line 304b. In a similar fashion, bit line pair 302b includes a first bit line 304c that is disposed to the left of a second bit line 304d at the top of the figure. After a first twist, bit line 304c is to the right of bit line 304d. After a second twist, bit line 304c is once again to the left of bit line 304d. Twisted bit line arrangements are advantageous as they distribute capacitively coupled signals from both sides of a bit line pair to both bit lines of the bit line pair. This cross coupling results in more common mode noise. Common mode noise is rejected by most data detection amplifiers (sense amplifiers) allowing for more effective data signal detection, and hence smaller memory cells and/or faster operating speeds.

In the bit line arrangement of FIG. 3, the bit line twisting is accomplished by twist structures 306. Each bit line pair (302a–302c) can be considered to include an integral bit line and a segmented bit line. The integral bit lines are integral structures that extend in the column direction and switch position in the bit line pairs inside the twist structures 306. In FIG. 3, bit lines 304b, 304d, and 304f are integral bit lines. The segmented bit lines include individual segments that are in alternating positions within the bit line pair, and are connected to one another by a cross-over element 308 within each twist structure 306. In FIG. 3, bit lines 304a, 304c and 304e are segmented bit lines. The cross-over elements 308 are formed from a different conductive layer than the integral bit line structures and bit line segments, and are therefore represented in FIG. 3 by dashed lines.

The bit line arrangement 300 of FIG. 3 is not conducive to phase-shifted masks because it is not possible to make adjacent structures using opposite phase light sources. This is best understood with reference FIG. 4. FIG. 4 sets forth a portion of the triple twist bit line arrangement of FIG. 3. The view of FIG. 4 represents the first conductive layer (the cross-over structures are omitted). As noted previously, in order for the interference effects of phase-shifted masks to be effective, adjacent features must be formed by the application of light having opposite phases. Toward the bottom of the figure, phase symbols are set forth to represent the phase used to form the structures. The symbol "0" represents one phase while the symbol "π" represents an opposite phase (a 180° phase shift, for example). While opposing phases can be maintained by the various features at the bottom of the figure, the particular twisting arrangement makes it impossible to maintain opposite phase toward the top of the figure. As just one example, integral bit line 402 cannot be of opposite phase to bit line segment 404 and adjacent bit line 406, and also be of opposite phase to the other adjacent bit line 408. Thus, the triple twist bit line arrangement of FIGS. 3 and 4 cannot be formed using phase-shifted mask techniques, and so cannot benefit from the small feature sizes attainable by such techniques.

A twisted bit line arrangement that can take advantage of phase-shifted mask approaches is set forth in FIG. 5. The twisted bit line arrangement is designated by the general reference character 500, and does not include integral bit lines that switch position within the bit line pair, and thus is conducive to phase-shifted mask approaches. Referring to FIG. 5, the bit line arrangement 500 is shown to include first bit line pairs 502a, 502c and 502e that alternate with second bit line pairs 502b and 502d. The first bit pairs (502a, 502c and 502e) each include integral bit line portions that extend in the column direction. For example, the integral bit line portions of bit line pair 502a are shown as items 504a and 504b. The second bit line pairs (502b and 502d) include a pair of upper bit line segments and lower bit line segments that are connected to one another in a "twisted" fashion by twist structures (506a and 506b). For example, bit line pair 502b includes upper bit line segments 508a and 508b and lower bit line segments 510a and 510b. Twist structure 506a includes a first cross-over element 512a that connects upper bit line segment 508a to lower bit line segment 510b, and a second cross-over element 512b that connects upper bit line segment 508b to lower bit line segment 510a. Twist structure 506a is shown to be generally aligned with twist structure 506b in the horizontal direction of FIG. 5.

The cross-over elements (512a and 512b) are formed from a different layer than that of the bit line segments, and so are shown as a dashed line. Thus, the bit line and bit line segments shown by a solid line in FIG. 5 can be considered to be formed from a first conductive layer, and the cross-over elements (512a and 512b) can be considered to be formed from a second conductive layer. The light phases used to form the various bit line and bit line segments of the first conductive layer are shown in FIG. 5 by the symbols "0" and "π." As shown in the figure, all adjacent features are of an opposite phase. Thus, the prior art bit line arrangement of FIG. 5 can be formed with a phase-shifted mask.

FIG. 5 further includes a supplementary conductive line shown as item 514. Supplementary conductive line 514 is formed from the same layer as the cross-over elements (512a and 512b), and so is also shown as a dashed line. The use of supplementary conductive lines can be particularly advantageous in dense memory device arrangements for carrying signals such as timing signals and/or column select signals.

A drawback to the twisted bit line arrangement if FIG. 5 arises out of the structures formed from the second conductive layer. The cross-over elements (512a and 512b) and supplementary conductive line 514 are shown to be separated from one another by the same spacing ("pitch") as the structures of the first conductive layer. Thus, the arrangement of FIG. 5 relies on the fact that the minimum spacing achievable by the first conductive layer is also achievable by the second conductive layer. Unfortunately, this is not always possible. The material of the second conductive layer or the lithographic steps used to pattern the second conductive layer, may force the minimum spacing requirements of the second conductive layer to be greater than that of the first conductive layer. In such a case, it may not be possible to create a bit line arrangement that retains enough room for supplementary conductive line, such as line 514 shown in FIG. 5.

In light of the above bit line arrangements and their accompanying drawbacks, it would be desirable to provide a twisted bit line arrangement that includes a compact bit line arrangement formed using phase-shifted lithography steps from a first conductive layer, that also allows for a larger pitch second conductive layer that can accommodate supplemental conductive lines.

SUMMARY OF THE INVENTION

According to the preferred embodiment, a semiconductor device includes twisted bit line pairs that have bit line segments formed from a first conductive layer. The bit line segments can be formed using phase-shifted masks and are connected to one another by cross-over structures formed from a second conductive layer. Supplemental conductive lines, formed from the same layer as the cross-over structures, are disposed over the bit lines, generally parallel to the bit lines. A greater pitch is allowable in the structures formed from the second conductive layer by offsetting the cross-over structures from one another, rather than aligning the structures with one another in a direction that is perpendicular to the bit lines.

According to one aspect of the preferred embodiment, twisted bit line pair portions alternate with non-twisted bit line pair portions.

According to another aspect of the preferred embodiment, the first conductive layer includes doped polysilicon and the second conductive layer includes a metal.

According to another aspect of the preferred embodiment, the supplemental conductive lines include column select lines.

DETAILED DESCRIPTION OF THE EMBODIMENTS

The preferred embodiment is a conductive line arrangement for a semiconductor device that provides data signals. The preferred embodiment allows for "twisted" data line pairs that can be formed with a first pitch from a first conductive layer using phase-shifted lithography steps. At the same time, supplemental conductive lines, that run generally parallel to the data line pairs, can be formed over the twisted data line pairs from a second conductive layer.

Figure 3:
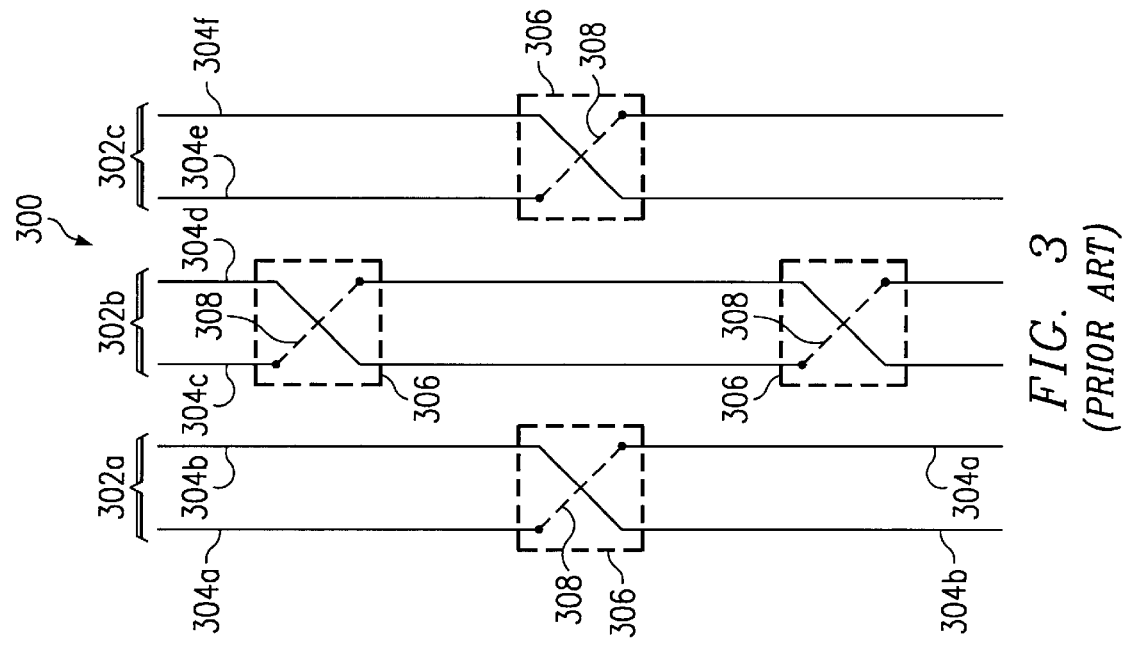
FIG. 3 is a schematic diagram illustrating a prior art "triple" twist bit line arrangement.
Figure 1:
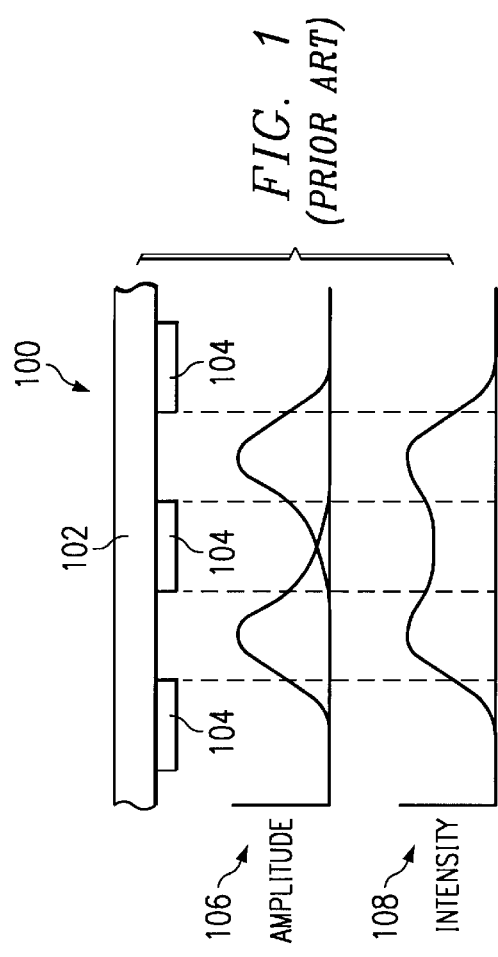
FIG. 1 sets forth a diagram and graphs illustrating a prior art conventional photolithography step.
Figure 2:
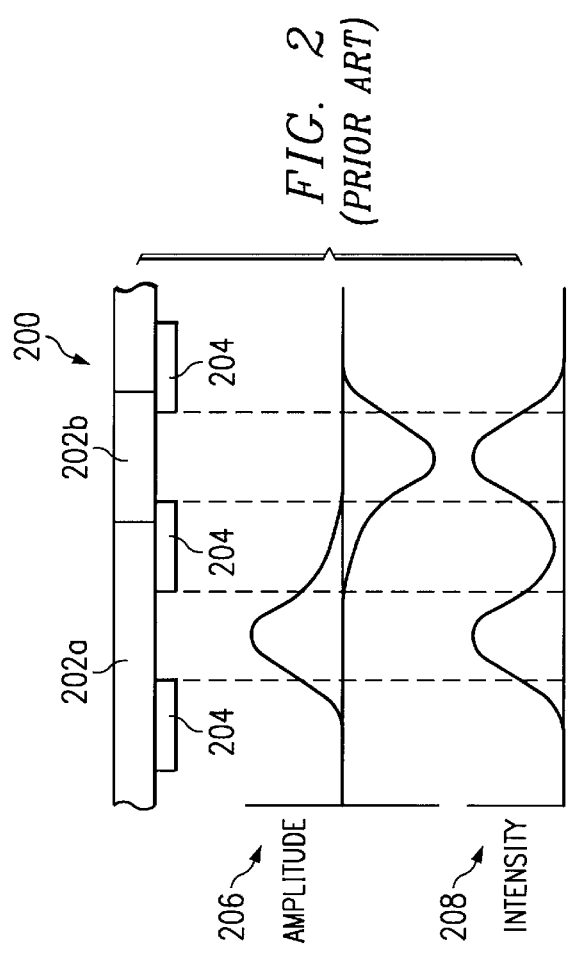
FIG. 2 sets forth a diagram and graphs illustrating a prior art phase-shifted photolithography step.
Figure 4:
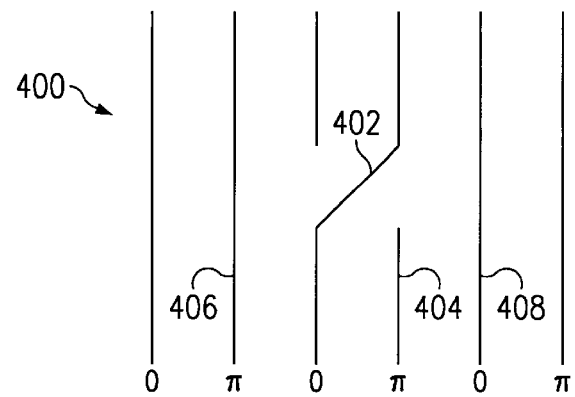
FIG. 4 is a schematic diagram illustrating the first conductive layer utilized to form the prior art bit line arrangement of FIG. 3.
Figure 5:
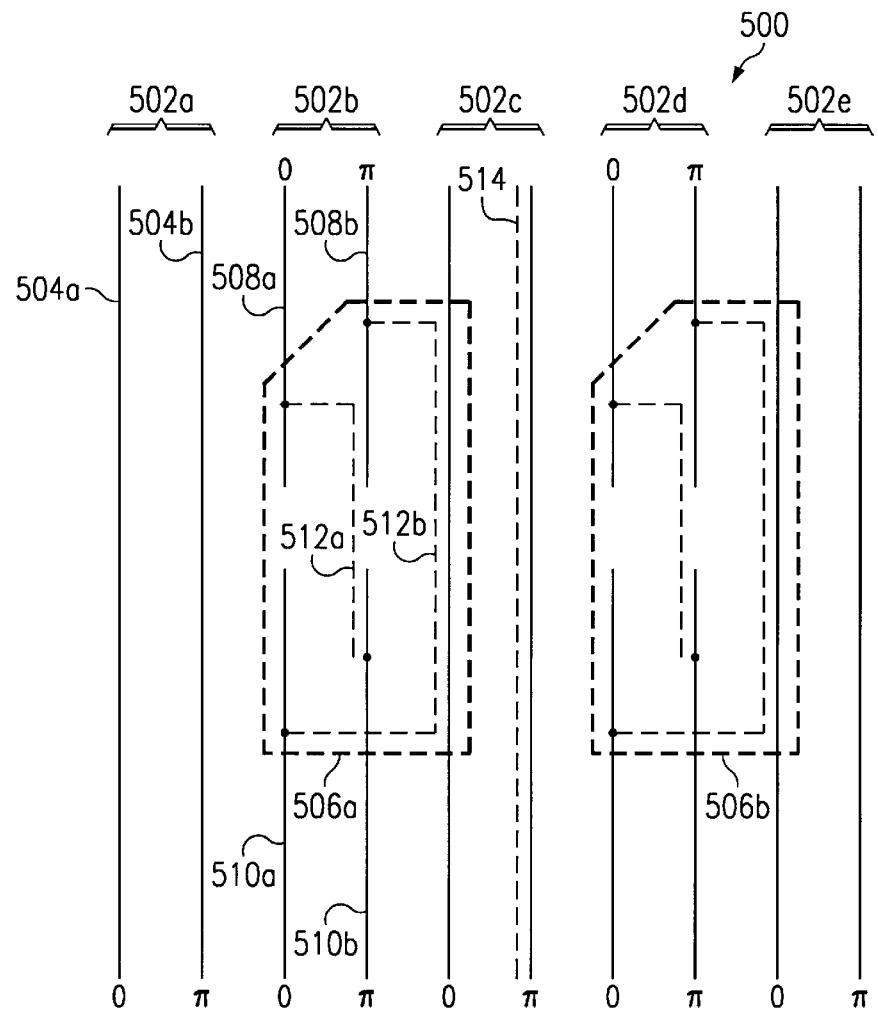
FIG. 5 is a schematic diagram illustrating a prior art twisted bit line arrangement that may be formed using phase-shifted photolithography steps.
Figure 6:
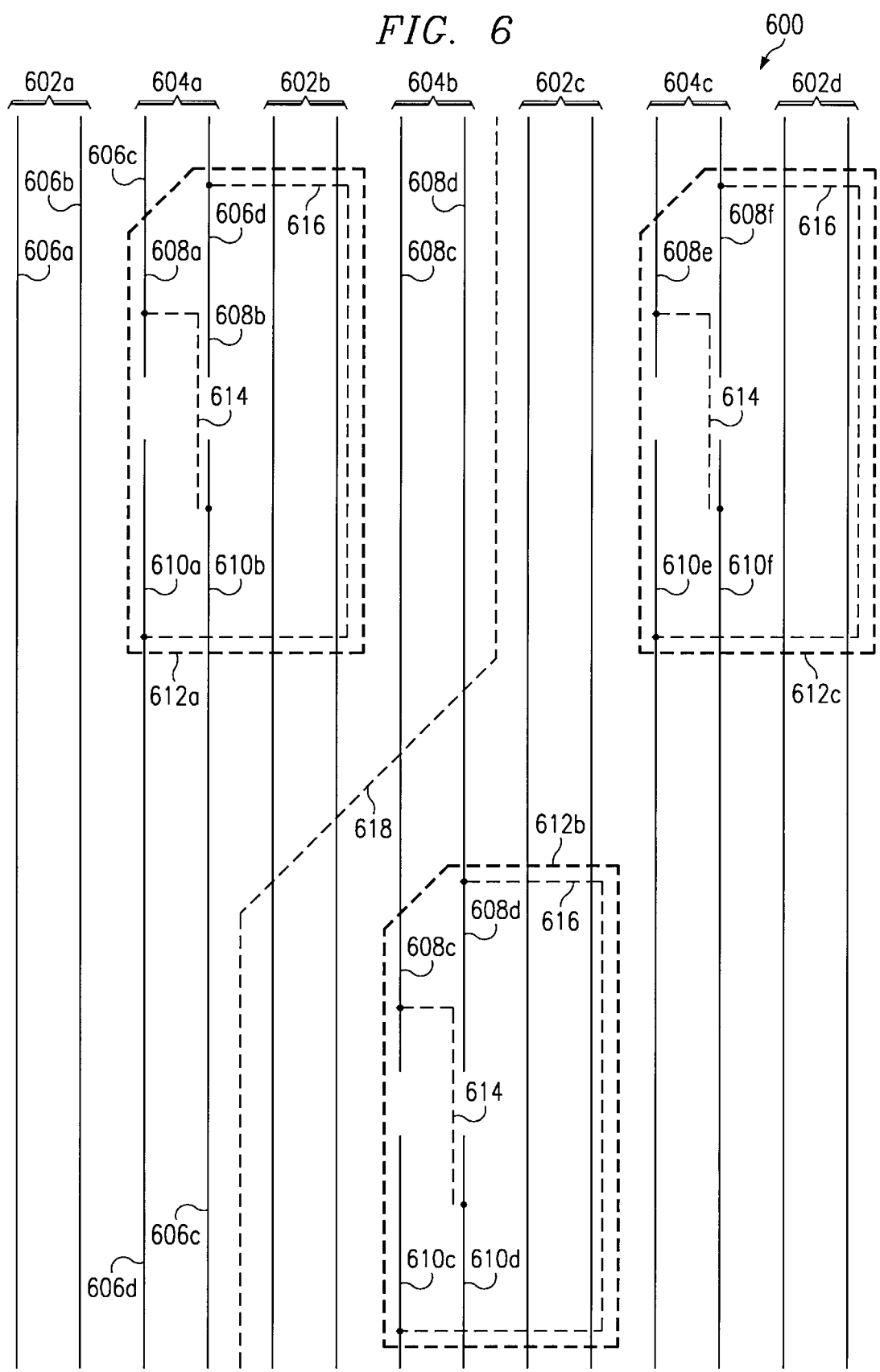
FIG. 6 is a schematic diagram illustrating a preferred embodiment.

Referring now to FIG. 6, a preferred embodiment is set forth in a schematic diagram and is designated by the general reference character 600. The preferred embodiment 600 is formed using a first conductive layer and a second conductive layer. To distinguish these two layers those structures formed from the first conductive layer will be illustrated by solid lines, and those structures formed from the second conductive layer will be illustrated by dashed lines. Conductive connections between the two layers are represented by a "dot" symbol.

The preferred embodiment 600 is shown to include first data line pairs 602a–602d and second data line pairs 604a–604c. The portions of the first data line pairs (602a–602d) set forth in FIG. 6 can be considered to be "non-twisted," in that the two data lines making up each first data line pair do not switch orientation with respect to one another. For example, the first data line pair 602a includes data lines 606a and 606b. Throughout the view of FIG. 6, data line 606a remains situated to left of data line 606b.

Unlike the first data line pairs (602a–602d), the second data line pairs (604a–604c) are "twisted." The twist results in the data lines that make up each second data line pair switching orientation with respect to one another. Thus, as shown in FIG. 6, the second data line pair 604a is shown to include two data lines 606c and 606d. Toward the top of FIG. 6, data line 606c is situated to the left of data line 606d. However, toward the bottom of FIG. 6 the data line 606c switches orientation with respect to data line 606d, and is situated to the right of data line 606d. In operation, the data lines will carry data signals for use by the semiconductor device, and the twisted arrangement advantageously couples signals from surrounding data lines to ultimately improve the speed and/or efficacy of detecting the data values.

In the particular arrangement of FIG. 6, first data line pairs (602a–602d) alternate with second data line pairs (604a–604d), resulting in each second data line pair being situated between two first data lines pairs. As just one example, second data line pair 604a is situated between first data line pairs 602a and 602b.

In the particular embodiment set forth in FIG. 6, the twisting of the second data line pairs (604a–604c) is accomplished by dividing the second data line pairs (604a–604c) into upper segment pairs (608a/608b, 608c/608d, and 608e/608f) and lower segment pairs (610a/610b, 610c/610d, and 610e/610f). It is understood that while the data line segment pairs (608a–608f and 610a–610f) are referred to as "upper" and "lower" segment pairs, these designations are only meant to distinguish the position of each segment pair with respect to one another in FIG. 6. Thus, the term "upper" and "lower" should not be construed as implying that the segments are formed from a particular fabrication layer, or limit the first and second segment pairs to one particular orientation with respect to one another.

As indicated by the solid lines of FIG. 6, the upper and lower segment pairs (608a–608f and 610a–610f) and the first data line pairs (602a–602d) are formed from the first conductive layer. The structures are separated from each other by a first minimum distance (i.e., have a first minimum pitch). The particular arrangement of the first conductive layer structures is conducive to phase-shifted lithography. Thus, the first conductive layer structures can be highly compact structures.

In the preferred embodiment 600, the twist of each second bit line pair (604a–604c) is introduced by an associated twist structure (612a–612c). Each twist structure (612a–612c) couples one of the upper segment pairs (608a/608b, 608c/608d, and 608e/608f) to a corresponding lower segment pair (610a/610b, 610c/610d, and 610e/610f) in a "twisted" fashion. The twist structures (612a–612c) of FIG. 6 are shown to each include a first cross-over element 614 and a second cross-over element 616. The first and second cross-over elements (614 and 616) each connect an upper segment (608a–608f) to an oppositely oriented lower segment (610a–610f). For example, the first cross-over element 614 of twist structure 612a couples upper segment 608a to lower segment 610b, and second cross-over element 616 of twist structure 612a couples upper segment 608b to lower segment 610a.

In the preferred embodiment 600, the first and second cross-over elements (614 and 616) are formed from a second conductive layer, and so are represented by dashed lines. Furthermore, the first and second cross-over elements (614 and 616) have a larger pitch than the upper and lower segments (608a–608f and 610a–610f). This is advantageous, because while many semiconductor manufacturing processes may be capable of patterning one conductive layer at a first pitch, other conductive layers may have to be patterned at a larger pitch. For example, a first conductive layer could include doped polysilicon with an accompanying silicide layer, and be formed at a first pitch. A second conductive layer could be a metallization layer, and be formed with a larger second pitch. In the particular example of FIG. 6, the first and second cross-over elements (614 and 616) have a pitch that is essentially twice that of the upper and lower segment pairs (608a–608f and 610a–610f) and the first data line pairs (602a–602d).

The arrangement of FIG. 6 results in each twisted bit line including two segments and one cross-over element. For example, data line 606c includes upper segment 608a, the first cross-over element 614 of twist structure 612a, and lower segment 610b. The corresponding complementary data line 606d includes upper segment 608b, second cross-over element 616 of twist structure 612a, and lower segment 610a.

The orientation of the twist structures (612a–612c) with respect to one another allows additional supplemental conductive lines to be formed from the second conductive layer. As shown in FIG. 6, the bit line pairs (602a–602d and 604a–604c) are disposed in a vertical direction in the figure. The twist structures (612a–612c) are generally adjacent to one another in the horizontal direction of FIG. 6. That is, twist structure 612b is to the right of twist structure 612a in the horizontal direction, and twist structure 612c is to the right of twist structure 612b in the horizontal direction. However, in order to accommodate additional supplemental conductive lines, adjacent twist structures are offset from one another in the vertical direction. In particular, while twist structure 612b is adjacent to twist structures 612a and 612c in the horizontal direction, it is offset from those twist structures (612a and 612c) in the vertical direction.

A supplemental conductive line, made possible by the unique twist structure (612a–612c) arrangement of the preferred embodiment 600, is shown as item 618 in FIG. 6. The supplemental conductive line 618 runs generally in the vertical direction in FIG. 6, first between twist structures 612a and 612c, and then between twist structures 612a and 612b. In this way, the vertical offset of twist structure 612b with respect to twist structures 612a and 612c allows for a vertically disposed supplemental conductive line 618 to be formed from the second conductive layer. This is possible, even though the twist structures (612a–612c) are formed with a larger pitch than the structures of the first conductive layer.

Figure 7:
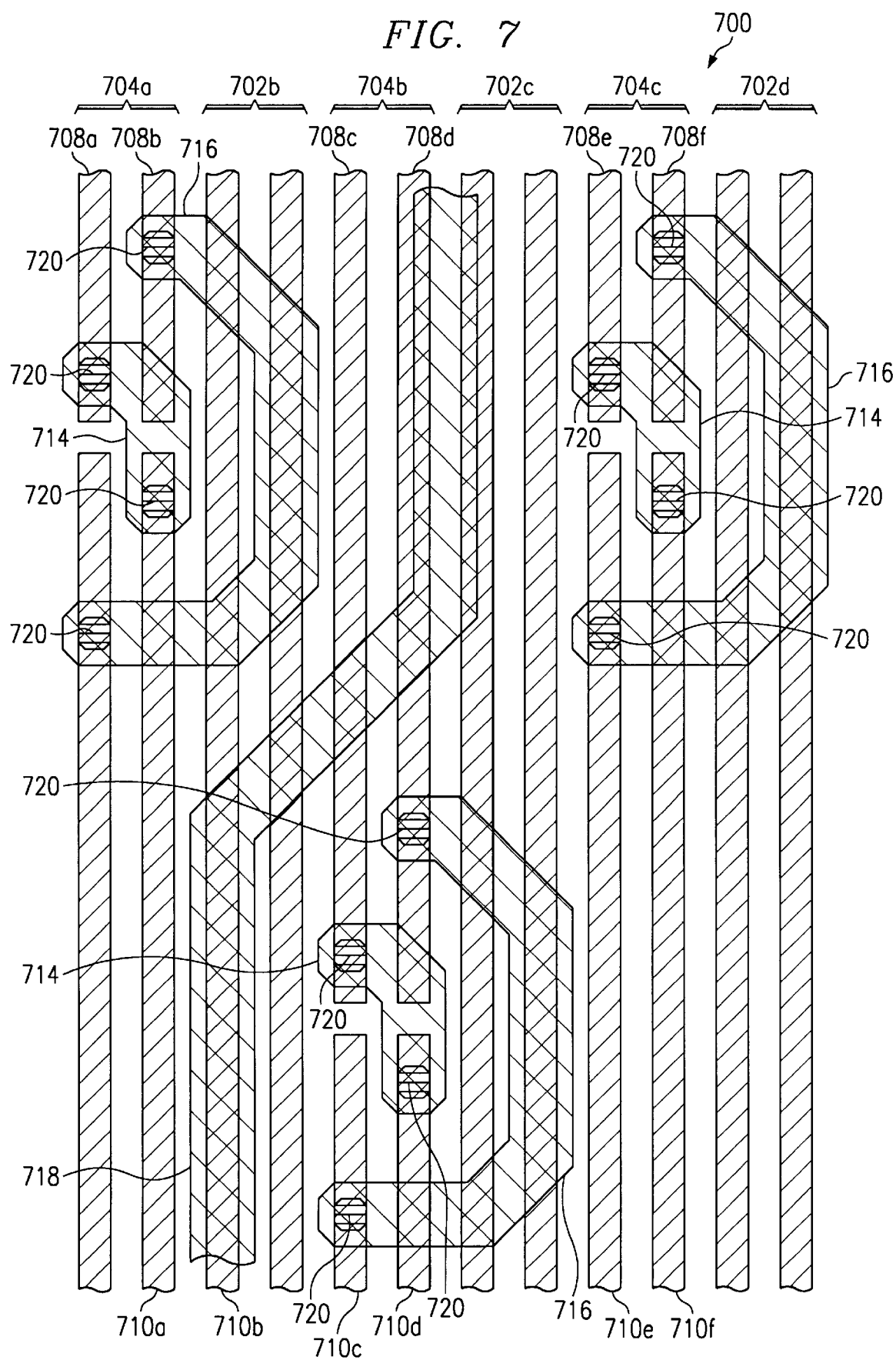
FIG. 7 is a top plan view illustrating one version of the preferred embodiment.

Referring now to FIG. 7, a top plan view is set forth illustrating one possible version of the preferred embodiment. The top plan view is designated by the general reference character 700, and includes representations of many of the items identified in FIG. 6. To that extent, like items will be referred by the same reference character, but with the first digit being "7" instead of a "6." Thus, FIG. 7 sets forth top plan views of those structure formed from a first conductive layer, including first data line pairs (702b–702d), second data line pairs (704a–704c), upper segments (708a–708f), and lower segments (710a–710f). In addition, structures formed from the second conductive layer are also set forth, including the first cross-over elements 714, second cross-over elements 716, and a supplemental conductive line 718.

In the example of FIG. 7 the second conductive layer is formed over the first conductive layer. Therefore, conductive connections between the two conductive layers are represented by contacts shown as items 720. In FIG. 7, the second conductive layer structures have a feature size and minimum separation distance (pitch) that is twice that of the first conductive layer structures. It is understood that the shape of the first and second cross-over elements (714 and 716) represent but one possible shape, and should in no way be considered limiting the second conductive layer structures to any particular shape.

The particular arrangement of the supplemental conductive line 718 should also not be construed as limiting the invention. For example, while the supplemental conductive line 718 is shown to have the same feature size as the cross-over elements (714 and 716) it may be advantageous to make a supplemental conductive line 718 with a larger feature size in order to provide a lower resistance signal carrying line. Larger feature size supplemental conductive lines can be accommodated by increasing the offset of adjacent twist structures.

While the preferred embodiment may be used in a variety of semiconductor devices for providing a highly dense arrangement of data signal carrying lines, one particularly advantageous application is that of a semiconductor memory device. In such an application the data line pairs can function as bit line pairs coupled to the memory cells of a memory cell array. The supplemental conductive lines can serve to carry column select ("Y-select") signals or other timing signals.

Figure 8:
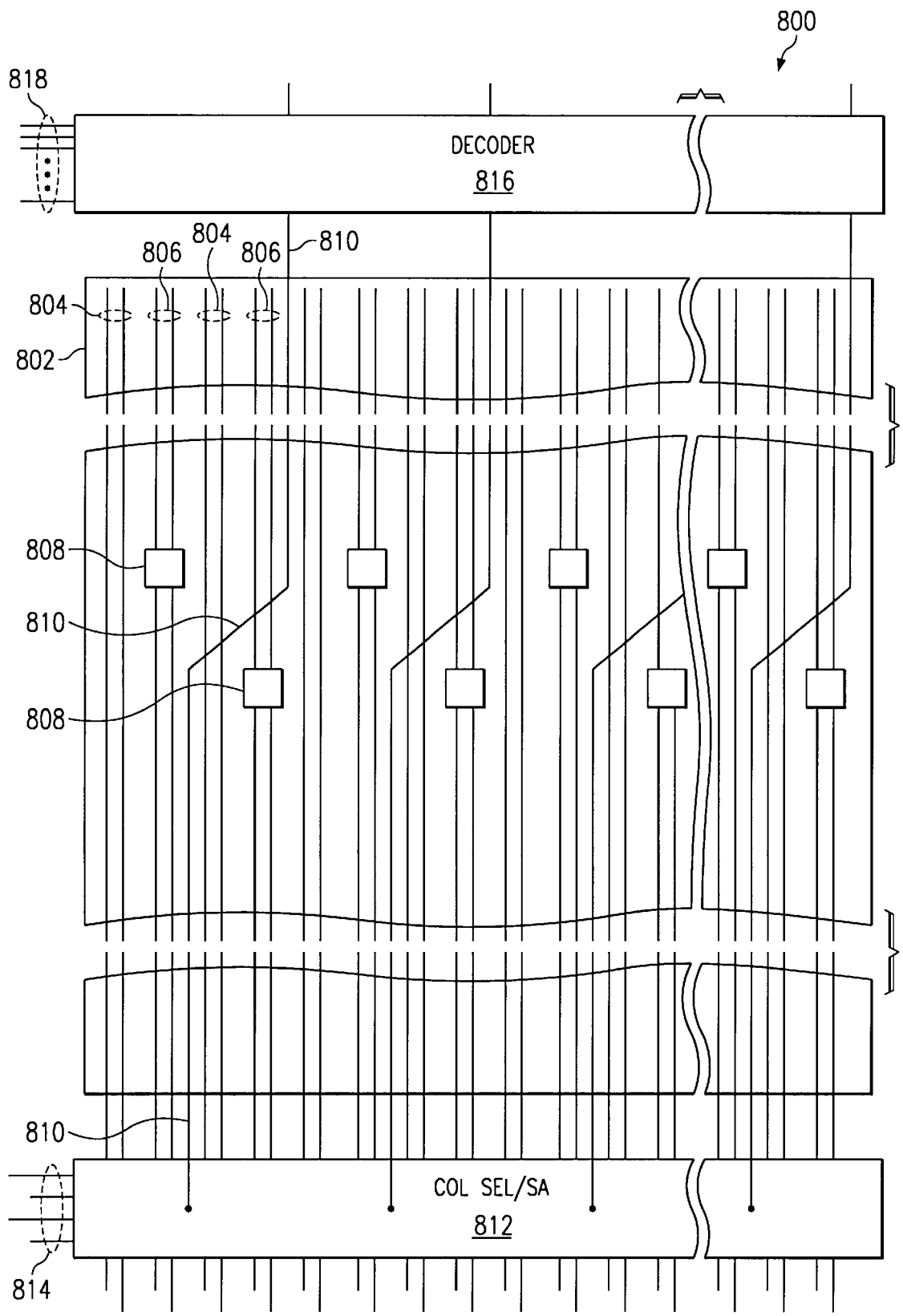
FIG. 8 is a block schematic diagram illustrating the preferred embodiment as utilized in a semiconductor memory device.

Referring now to FIG. 8, a block schematic diagram is set forth illustrating one example of the preferred embodiment as utilized in the semiconductor memory device. A portion of the semiconductor memory device is designated by the general reference character 800 and is shown to include a memory cell array 802. The memory cell array 802 includes a number of memory cells arranged into rows that extend in the horizontal direction of FIG. 8, and columns that extend in the vertical direction. First data line pairs and second data line pairs, two of which are shown as items 804 and 806, respectively, are disposed over the memory cell array 802 and are coupled to memory cells of the same column. The data line pairs (804 and 806) therefore function as bit line pairs. The second data line pairs 806 each include a corresponding twist structure 808 for introducing a twist into the data line pairs (804 and 806). Also set forth in FIG. 8 are supplemental conductive lines, one of which is shown as item 810.

The data line pairs (804 and 806) are coupled to a column select-sense amplifier circuit 812. According to timing signals and column select signals, the column select-sense amplifier circuit 812 amplifies data signals on the data line pairs (804 and 806), and couples selected of the data line pairs to data input/output (I/O) lines 814.

The timing and column select signals are generated by a decoder circuit 816 in response to timing and address signals 818. In the arrangement of FIG. 8, the timing and address signals 818 produce column select signals that are carried by the supplemental conductive lines 810. In this way, the preferred embodiment, when implemented in a semiconductor memory device, allows the supplemental conductive to be used as column select lines and timing lines.

It is understood that the preferred embodiment may be implemented in a standalone semiconductor memory device, or an "embedded" memory that is included as one portion of a larger integrated circuit device (e.g., a microprocessor or microcontroller). Also, as noted above, the preferred embodiment could be used in other semiconductor devices that require dense arrangements of data carrying lines. As just two examples, programmable logic devices (PLDs) or programmable logic arrays (PLA) may benefit from the teachings of the preferred embodiment.

It is also noted that while the preferred embodiment sets forth bit lines that include only one twist, bit lines having more than one twist are possible. Such multiple twisted bit lines could include offset twist structures that provide enough room for supplemental conductive lines to run generally parallel to the data lines.

Thus, while the present invention has been described in detail, it should be understood that various changes, substitutions, and alterations could be made without departing from the spirit and scope of the invention as defined by the appended claims.

What is claimed is:

1. In a semiconductor device, a data line arrangement comprising:
   a plurality of first data line pairs, wherein each data line extends in a first direction;
   a plurality of second data line pairs extending in the first direction, each second data line pair being situated between two first data line pairs, each second data line pair comprising
      a first segment pair that includes a first data line segment and a second data line segment, and
      a second segment pair that includes a first data line segment and a second data line segment;
   a cross-over structure associated with each second data line pair, each cross-over structure including
      a first cross-over element that couples the first data line segment of its associated first segment pair to the second data line segment of its associated second segment pair, and
      a second cross-over element that couples the second data line segment of its associated first segment pair to the first data line segment of its associated second segment pair,
   the cross-over structures are offset from one another with respect to the first direction.

2. The data line arrangement of claim 1, wherein:
   the semiconductor device is a memory device;
   the first data line pairs are bit lines; and
   the second data line pairs are bit lines.

3. The semiconductor memory device of claim 1, wherein:
   the first data line pairs are separated from one another by a first pitch; and
   within each cross-over structure, the first cross-over elements are separated from the second cross-over elements by a second pitch, the second pitch being greater than the first pitch.

4. The semiconductor memory device of claim 2, further including:
   the second data line pairs are separated from one another by a first pitch; and
   within each cross-over structure, the first cross-over elements are separated from the second cross-over elements by a second pitch, the second pitch being greater than the first pitch.

5. The semiconductor memory device of claim 1, wherein:
   the first data line pairs and second data line pairs are formed from a first conductive layer; and
   the first and second cross-over elements are formed from a second conductive layer.

6. The semiconductor memory device of claim 5, further including:
   at least one control line from the second conductive layer, the at least one control line being generally disposed in the first direction and having a portion that is situated between adjacent cross-over structures.

7. In a semiconductor memory device, a twisted bit line arrangement comprising:
   a plurality of first twisted bit line pairs, each first twisted bit line pair including
      a first conductive line disposed in a column direction,
      a second conductive line disposed in the column direction, the second conductive line being adjacent to the first conductive line in a row direction that is generally perpendicular to the column direction,
      a third conductive line disposed in the column direction, the third conductive line being adjacent to the first conductive line in the column direction, and
      a fourth conductive line disposed in the column direction, the fourth conductive line being adjacent to the second conductive line in the column direction,
      a first twist structure that couples the first conductive line to the fourth conductive line and the second conductive line to the third conductive line; and
   at least one second twisted bit line pair disposed between two first twisted bit line pairs, the second bit line pair including
      a fifth conductive line disposed in a column direction,
      a sixth conductive line disposed in the column direction, the sixth conductive line being adjacent to the fifth conductive line in the row direction,
      a seventh conductive line disposed in the column direction, the seventh conductive line being adjacent to the fifth conductive line in the column direction, and
      an eighth conductive line disposed in the column direction, the eighth conductive line being adjacent to the sixth conductive line in the column direction,
      a second twist structure that couples the fifth conductive line to the eighth conductive line and the sixth conductive line to the seventh conductive line, the second twist structure being offset from the first twist structures in the column direction.

8. The twisted bit line arrangement of claim 6, wherein:
   the first twist structures are aligned with one another in the row direction.

9. The twisted bit line arrangement of claim 6, further including:
   at least one non-twisted bit line pair disposed between the second twisted bit line pairs and each of its adjacent first twisted bit line pairs.

10. A dense data line arrangement for a semiconductor device, comprising:
    a plurality of first conductive layer lines arranged in a first direction, the first conductive layer lines including
       upper segment pairs having a first pitch, and
       lower segment pairs having the first pitch;
    a twist structure associated with each upper segment pair, the twist structures being arranged in a second direction that is generally perpendicular to the first direction, each twist structure coupling its associate upper segment pair to the corresponding lower segment pair to form a twisted bit line pair, each twist structure being formed from a second conductive layer and having a second pitch that is greater than the first pitch, the twist structures being offset with respect to one another in the first direction;

a plurality of second conductive layer lines arranged in the first direction the second conductive layer lines extending between adjacent offset twist structures.

11. The data line arrangement of claim 10, wherein:

the second conductive lines are formed with the second pitch.

12. The data line arrangement of claim 10, wherein:

the second conductive lines are formed with a third pitch that is greater than the second pitch.

13. The data line arrangement of claim 10, wherein:

each upper segment pair includes a first upper segment and a second upper segment disposed to a first side of the first upper segment;

each lower segment pair includes a first lower segment and a second lower segment disposed to the first side of the first lower segment; and each twist structure includes
   a first cross-over element that couples the first upper segment to the second lower segment, and
   a second cross-over element that couples the second upper segment to the first lower segment.

14. In a semiconductor device, a data line arrangement comprising:

a plurality of first data line pairs separated from one another by a first pitch, wherein each data line extends in a first direction;

a plurality of second data line pairs extending in the first direction, each second data line pair being situated between two first data line pairs, each second data line pair comprising:

a first segment pair that includes a first data line segment and a second data line segment;

a second segment pair that includes a first data line segment and a second data line segment; and a cross-over structure associated with each second data line pair, each cross-over structure including:

a first cross-over element that couples the first data line segment of its associated first segment pair to the second data line segment of its associated second segment pair, and a second cross-over element that couples the second data line segment of its associated first segment pair to the first data line segment of its associated second segment pair;

wherein the cross-over structures are offset from one another with respect to the first direction and further wherein the first cross-over elements are separated from the second cross-over elements by a second pitch within each cross-over structure, the second pitch being greater than the first pitch.

15. The semiconductor memory device of claim 14, wherein the second data line pairs are separated from one another by the first pitch.

\* \* \* \* \*